United States Patent
Knecht et al.

(10) Patent No.: US 6,946,919 B2
(45) Date of Patent: Sep. 20, 2005

(54) CONTROLLABLE CRYSTAL OSCILLATOR COMPONENT

(75) Inventors: Thomas Knecht, Dundee, IL (US); Marlin Luff, Wheaton, IL (US); Steven J. Fry, Carlisle, PA (US)

(73) Assignee: CTS Corporation, Elkhart, IN (US)

( * ) Notice: Subject to any disclaimer, the term of this patent is extended or adjusted under 35 U.S.C. 154(b) by 311 days.

(21) Appl. No.: 10/047,249

(22) Filed: Jan. 14, 2002

(65) Prior Publication Data

US 2003/0137361 A1 Jul. 24, 2003

(51) Int. Cl.[7] .............................................. H03L 7/00
(52) U.S. Cl. ..................... 331/36 C; 331/36 R; 331/66; 331/68; 331/108 C; 331/177 V; 331/158; 331/177 R; 331/176
(58) Field of Search .............................. 330/36 C, 36 R, 330/66, 68, 108 C, 108 D, 177 V, 158, 177 R, 176

(56) References Cited

U.S. PATENT DOCUMENTS

| | | | |
|---|---|---|---|
| 4,180,783 A | 12/1979 | Khalifa | 331/2 |
| 4,706,045 A | * 11/1987 | Ouyang et al. | 331/117 FE |
| 4,987,373 A | 1/1991 | Soo | 328/155 |
| 5,349,310 A | 9/1994 | Reider et al. | 331/18 |
| 5,405,476 A | 4/1995 | Knecht | |
| 5,432,827 A | 7/1995 | Mader | 375/576 |
| 5,446,954 A | 9/1995 | Knecht et al. | |
| 5,512,860 A | 4/1996 | Huscroft et al. | 331/1 A |
| 5,563,531 A | 10/1996 | Meyer | 327/3 |
| 5,604,468 A | 2/1997 | Gillig | |
| 5,877,657 A | 3/1999 | Yoshinaka | 331/16 |
| 5,929,712 A | 7/1999 | Kuriyama | 331/25 |
| 5,952,890 A | 9/1999 | Fallisgaard et al. | 331/18 |

(Continued)

FOREIGN PATENT DOCUMENTS

| | | |
|---|---|---|
| EP | 0 724 334 B1 | 3/1999 |
| JP | 54-118993 | 9/1979 |
| JP | 57-200370 | 12/1982 |
| JP | 407226887 | * 8/1995 |
| JP | 2000 151283 A | 5/2000 |

OTHER PUBLICATIONS

Laute et al. "A Fully Silicon Monolithic Integrated 868/915MHz FSK/FM/ASK Transmitter Chip" Digeit of Papers Topical Meeting on Silicon Monolithic Integrated Circuits in RF Systems 2000 pp 38–42.*

Primary Examiner—Michael B. Shingleton
(74) Attorney, Agent, or Firm—Steven Weseman; Mark Bourgeois

(57) ABSTRACT

A frequency-adjustable oscillator suitable for digital signal clock synchronization comprises a crystal oscillator circuit for generating a driving signal and having a voltage-variable control input for adjusting a frequency of the driving signal, a phase detector circuit for generating a phase offset signal, a filter which operates on the phase offset signal to produce a VCO control signal, a voltage controlled oscillator circuit operably linked to the filter and responsive to the VCO control signal for generating an analog controlled-frequency signal, a frequency divider circuit for generating a reduced frequency feedback signal in response to the controlled-frequency signal. The frequency-adjustable oscillator also includes a double-sided package including a platform having a central portion and an outer portion with sidewalls extending substantially upwardly and substantially downwardly from the outer portion of the platform. The upwardly extending sidewalls and the platform form a first cavity adapted to receive and electrically connect the quartz resonator. The downwardly extending sidewalls and the platform forming a second cavity adapted to receive and electrically connect at least one electronic component. A cover is coupled with the first cavity to create an isolated environment for containing the quartz resonator.

23 Claims, 8 Drawing Sheets

U.S. PATENT DOCUMENTS

| | | | |
|---|---|---|---|
| 5,987,085 A | 11/1999 | Anderson | 375/374 |
| 6,066,989 A | 5/2000 | Knecht et al. | 331/18 |
| 6,081,164 A | 6/2000 | Shigemori et al. | 331/16 |
| 6,133,795 A | 10/2000 | Williams | 331/9 |
| 6,154,095 A | 11/2000 | Shigemori et al. | 331/16 |
| 6,172,576 B1 | 1/2001 | Endo et al. | 331/116 R |
| 6,181,217 B1 | 1/2001 | White | 331/158 |
| 6,198,337 B1 | 3/2001 | Matsuura | |
| 6,229,249 B1 | 5/2001 | Hatanaka et al. | |
| 6,229,404 B1 | 5/2001 | Hatanaka | |
| 6,239,669 B1 | 5/2001 | Koriyama | |
| 6,304,151 B1 | 10/2001 | Uehara et al. | |

\* cited by examiner

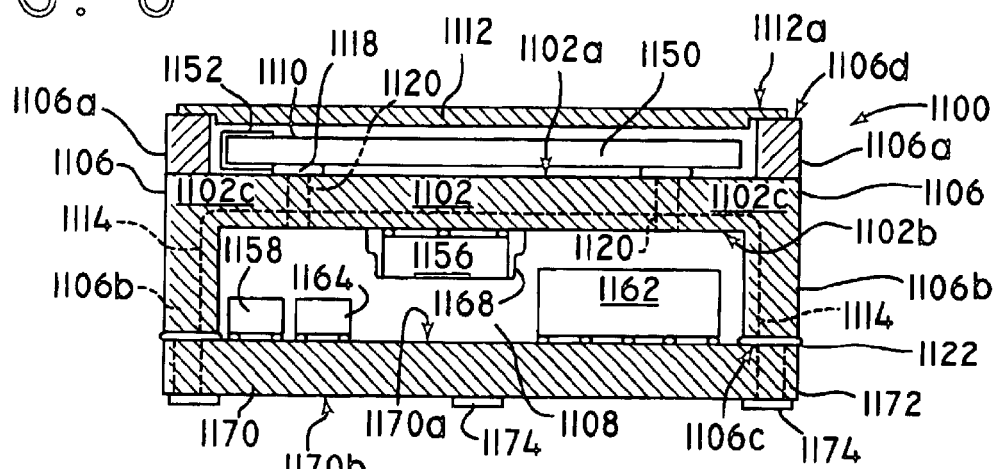
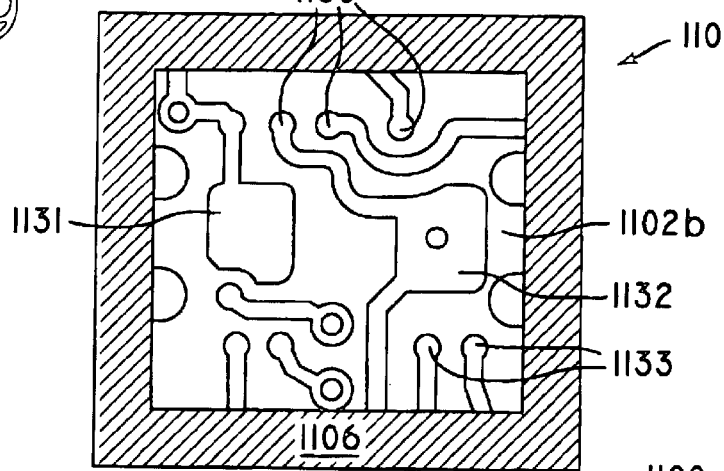
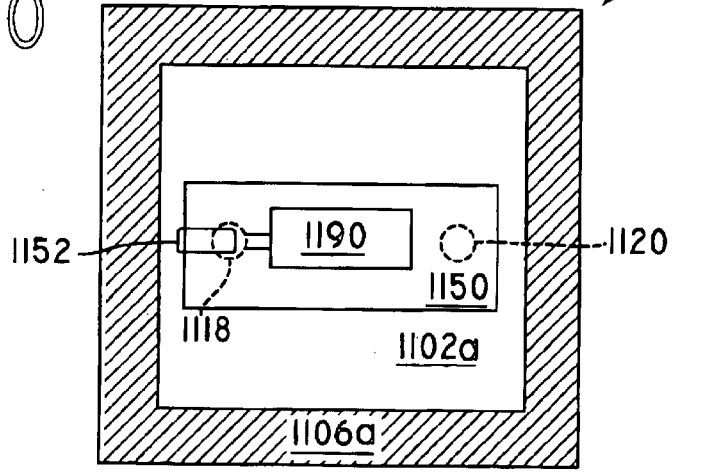

CONTROLLABLE CRYSTAL OSCILLATOR COMPONENT

REFERENCE TO RELATED APPLICATIONS

This application is related to U.S. utility application entitled, "Controllable Crystal Oscillator," having Ser. No. 09/829,129, filed on Apr. 9, 2001.

TECHNICAL FIELD

This invention relates to voltage controlled crystal oscillators, and in particular, to cost-effective circuit configurations for relatively high-frequency voltage controlled crystal oscillators.

BACKGROUND

High capacity data networks rely on signal repeaters and sensitive receivers for low-error data transmission. To decode and/or cleanly retransmit a serial data signal, such network components include components for creating a data timing signal having the same phase and frequency as the data signal. This step of creating a timing signal has been labeled "clock recovery."

Data clock recovery requires a relatively high purity reference signal to serve as a starting point for matching the serial data signal clock rate and also circuitry for frequency adjustment. The type, cost and quality of the technology employed to generate the high purity reference signal varies according to the class of data network applications. For fixed large-scale installations, an "atomic" clock may serve as the ultimate source of the reference signal. For remote or movable systems, components including specially configured quartz resonators have been used. As communication network technology progresses towards providing higher bandwidth interconnections to local area networks and computer workstations, the need has grown for smaller and cheaper clock recovery technology solutions.

For many clock recovery applications, the reference signal generator must be adjustable, i.e. controllable, and then operate on a precisely defined operating curve. This adjustability requirement is conveniently defined as an Absolute Pull Range (APR). APR is defined as the controllable frequency deviation (specified in ±ppm) from the nominal frequency ($F_0$) over a wide range of operating parameters, including frequency tolerance, frequency stability, supply voltage, output load, and time (i.e. aging). Clock recovery may require controllably oscillators having both a minimum and a maximum APR.

For higher frequency applications now in demand, e.g., above 500 MHz, more conventional resonator technologies such as standard AT-cut crystals have not been fully successful. The recognized upper limit for fundamental-mode, straight blank AT-cut crystals is about 70 MHz. Hence, some type of frequency multiplication must be employed to generate the required higher frequency reference signal. With frequency multiplication comes increased circuit sensitivities for phase noise, jitter, non-linearities and long-term stability.

Available alternatives to standard quartz/crystal resonators include the use of surface acoustic wave (SAW) resonators and special crystal blank configurations such as inverted mesa. These alternatives involve more complex manufacturing steps and therefore higher cost.

The focus on cost cutting for data signal clock recovery components is reflected in U.S. Pat. No. 5,987,085 to Anderson. The Anderson patent illustrates a clock recovery circuit developed in an effort to eliminate the crystal-based reference clock requirement. Anderson failed to identify the target frequencies or present operating data, however.

There continues to be a need for a cost-effective voltage controlled crystal oscillator suitable for data signal clock recovery applications. Specifically, it would be desirable to provide a high frequency voltage controlled oscillator utilizing conventional crystal resonators.

SUMMARY

A controllable oscillator suitable for use in digital signal clock synchronization is provided. The oscillator includes a crystal oscillator circuit for generating a driving signal, a phase detector circuit, a low pass loop filter, a voltage controlled oscillator (VCO) circuit, a frequency divider circuit and a sinewave-to-logic level translator circuit.

The crystal oscillator circuit generates a driving signal and has a voltage-variable control input for adjusting the frequency of the driving signal. The crystal oscillator circuit further includes a voltage variable capacitance element, such as a discrete varactor responsive to the control input, an AT-cut quartz resonator operably linked to the varactor, and a gain stage for energizing the discrete varactor.

The phase detector subcircuit is adapted to generate a phase offset signal. The loop filter operates on the phase offset signal to produce a control voltage, which is received by the voltage controlled oscillator (VCO) subcircuit. The voltage controlled oscillator (VCO) circuit is operably linked to the loop filter and responsive to the control voltage for generating an analog controlled-frequency signal.

The frequency divider circuit has a preselectable divider ratio and is operably linked between the voltage controlled-frequency oscillator circuit and the phase detector circuit. The frequency divider generates a reduced frequency feedback signal in response to the controlled-frequency signal. The phase detector circuit is responsive to the feedback signal and the driving signal such that the phase offset signal varies according to a phase difference between the feedback signal and the driving signal.

The oscillator also includes the sinewave-to-logic level translator subcircuit which is operably linked to the voltage controlled oscillator (VCO) for generating a digital (or logic level) output signal having substantially the same frequency as the controlled-frequency signal.

In a preferred embodiment, the AT-cut quartz resonator is adapted to resonate in fundamental mode at about 19.44 Megahertz, the divider subcircuit has a preselected divider ratio of about 32:1 and the oscillator exhibits an operating frequency within the area defined between the following two equations:

$$f1_{output}=0.04526(V_{control})+621.9430 \text{ Megahertz}$$

$$f2_{output}=0.04526(V_{control})+621.9679 \text{ Megahertz}$$

for $V_{control}$ values in the range of about 0.15 volts to about 3.15 volts, where $V_{control}$ is a DC voltage level of the voltage-variable input.

A packaged oscillator embodiment of the present invention further includes a double-sided package including a platform having a central portion and an outer portion with sidewalls extending substantially upwardly and substantially downwardly from the outer portion of the platform. The upwardly extending sidewalls and the platform form a first cavity adapted to receive and electrically connect the quartz resonator. The downwardly extending sidewalls and the platform form a second cavity adapted to receive and electrically connect at least one electronic component. A cover is coupled with the first cavity defining a hermetic environment for containing the quartz resonator.

The package oscillator also includes a laminate substrate coupled with the second cavity. The package platform has a second-cavity side with at least one electronic component mounted on this second-cavity side. The laminate substrate cover has a cavity facing side to receive at least one electronic component and an outward facing side which includes contacts to facilitate surface mounting.

An alternate embodiment of the present invention is a frequency-adjustable oscillator with reduced temperature dependence. The frequency-adjustable oscillator includes a phase detector circuit for generating a phase offset signal, a loop filter operating on the phase offset signal to produce a VCO control signal, a voltage controlled oscillator circuit operably linked to the filter and responsive to the VCO control signal for generating an analog controlled-frequency signal and a frequency divider circuit operably linked between the voltage controlled-frequency oscillator circuit and the phase detector circuit for generating a reduced frequency feedback signal in response to the controlled-frequency signal.

The phase detector circuit is responsive to the feedback signal and a driving signal such that the phase offset signal varies according to a phase difference between the feedback signal and the driving signal. The driving signal is generated by a quartz resonator operably linked to a resonator gain stage and a variable capacitance circuit. The variable capacitance circuit is linked to a temperature compensation logic, a temperature sensor, and a control input. The temperature compensation logic generates a capacitance adjustment in response to temperature changes to block temperature induced frequency variations. Via the variable capacitance circuit, the control input effects changes to the resonator capacitive load to allow precise external control of the driving frequency.

There are other advantages and features of this invention which will be more readily apparent from the following detailed description of the preferred embodiment of the invention, the drawings, and the appended claims.

BRIEF DESCRIPTION OF THE FIGURES

In the accompanying drawings that form part of the specification, and in which like numerals are employed to designate like parts throughout the same.

FIG. 8 is a schematic cross-section view of a packaged oscillator embodiment of this invention;

FIG. 9 is an exemplary schematic bottom view, partly in section, of the lower cavity of the packaged oscillator of FIG. 8 shown unpopulated with components to reveal exemplary connection pads; and FIG. 10 is an exemplary schematic top view, partly in section, of the upper cavity of the packaged oscillator of FIG. 8 shown without a cover to reveal details of the crystal blank mounting.

DETAILED DESCRIPTION OF PREFERRED EMBODIMENTS

While this invention is susceptible to embodiment in many different forms, this specification and the accompanying drawings disclose only preferred forms as examples of the invention. The invention is not intended to be limited to the embodiments so described, however. The scope of the invention is identified in the appended claims.

In the FIGURES, a single block or cell may indicate several individual components and/or circuits that collectively perform a single function. Likewise, a single line may represent several individual signals or energy transmission paths for performing a particular operation.

Figure 1:
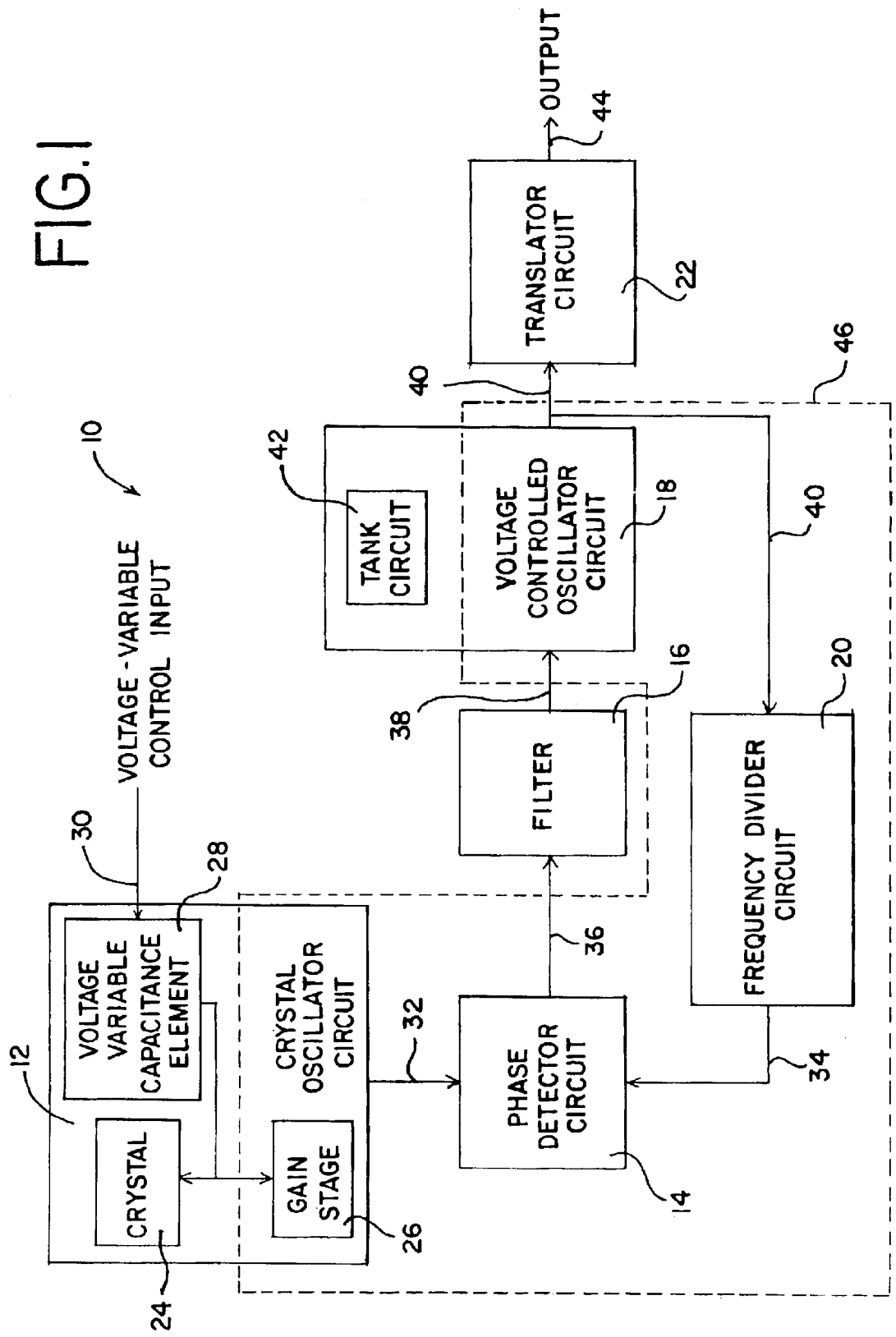
FIG. 1 is a schematic diagram of a controllable oscillator according to an embodiment of this invention.

Turning to FIG. 1, a frequency controllable oscillator 10 includes a crystal oscillator circuit 12, a phase detector 14, a loop filter 16, a voltage controlled oscillator (VCO) circuit 18, a frequency divider circuit 20 and a sinewave-to-logic level translator circuit 22.

Crystal oscillator circuit 10 includes a quartz resonator 24 operably linked to gain stage elements 26 and a voltage variable capacitance element 28. A variety of crystal oscillator circuit configurations may be used including those referred to under the designations Pierce, Colpitts, Hartley, Clapp, Driscoll, Seiler, Butler and Miller, with Colpitts being presently preferred. Voltage variable capacitance element 28 exhibits a varying capacitance in response to changes in a DC voltage-variable control input 30. A voltage change made to input 30 adjusts the capacitive load of the oscillator circuit and the frequency of its output driving signal, which is represented in FIG. 1 with numeral 32.

Input 30 is preferably voltage variable. Also contemplated for the control input is a digital number (or equivalent) input that is converted to an analog voltage signal by a conventional digital to analog converter.

Voltage variable capacitance element 28 is preferably a discrete variable capacitance diode (i.e. a varactor or varactor diode) although other voltage controlled variable capacitance mechanisms are contemplated. For an embodiment with increased on-chip integration, variable capacitance element 28 includes one or more banks of transistor-switchable capacitors in a parallel circuit configuration and coupled to control logic for selectively activating capacitors in response to the control voltage. Alternatively, variable capacitance element 28 includes one or more banks of transistor-switchable on-chip varactor elements or combinations of capacitors and on-chip varactors coupled to control logic for selectively activating integrated varactors and capacitors in response to the control voltage. Circuits for providing on-chip variable capacitance suitable for temperature compensating crystal oscillators are described in U.S. Pat. No. 4,827,226, issued to Connell et al., and U.S. Pat. No. 5,994,970, issued to Cole et al., both of which are incorporated herein by reference to the extent it is not inconsistent.

Quartz resonator 24 is preferably a cost-effective AT-cut crystal adapted to resonate in fundamental mode at a frequency in the range of about 19.44194 MHz to about 20.828

MHz against loads in the range of about 6 picofarads to about 14 picofarads. Preferred are crystals adapted to resonate at 19.44 MHz or 20.828 MHz each against a 10 picofarad load. Crystals adapted for relatively lower capacitive loads are preferred to allow a larger range for frequency control.

Driving signal 32 is received by phase detector (or phase comparator) circuit 14 and compared to a reduced frequency feedback 34 signal from divider circuit 20. Phase detector 14 produces a phase offset signal 36 having a DC voltage level proportional to the phase difference between reduced frequency feedback signal 34 and driving signal 32.

More specifically, phase detector 14 preferably includes circuit elements generating pulses proportional to the phase difference between reduced frequency feedback signal 34 and driving signal 32. The pulses are collected by a charge pump (not separately shown) that is converted to a corresponding DC voltage variable signal for controlling voltage controlled oscillator (VCO) 18. A variety of phase detector circuit configurations are suitable for the present invention. Exemplary phase detector circuits and construction details are described in *Monolithic Phase-Locked Loops & Clock Recovery Circuits: Theory and Design*, Behzad Rasavic ed., IEEE (1996).

A preferred phase detector circuit employs flip-flops in a configuration which has been labeled "digital phase/frequency detector" or "digital tri-state comparator." This arrangement includes two D flip-flops whose outputs are combined with a NAND gate which is then tied to the reset on each flip-flop. The outputs of the flip-flops are also connected to the charge pump inputs. Each flip-flop output signal is a series of pulses whose frequency is related to the flip-flop input frequency. When both inputs of the flip-flop are identical, the signals are both frequency and phased locked. If they are different, they will provide signals to the charge pump which will either charge or discharge the loop filter or place the charge pump in a high impedance state thereby maintaining the charge on the loop filter.

The charge pump (not separately shown) includes two transistors, one for charging loop filter 16 and one for discharging loop filter 16. The charge pump inputs are the outputs of the flip-flops discussed above. If both amplifier inputs are low, the amplifier shifts to a high impedance state-thereby maintaining the loop filter charge.

Oscillator 10 includes a loop filter 16 operably linked between phase detector 14 and voltage controlled oscillator (VCO) 18 for stripping high frequency components from the VCO control signal.

Voltage controlled oscillator (VCO) 18 is responsive to changes in the DC voltage level of a filtered VCO control signal 38 and provides an analog controlled-frequency signal 40. Loop filter 16 serves to integrate the pulses received from phase detector 14 to create a control voltage at VCO control signal 38. A variety of circuit configurations are suitable for providing the VCO. Exemplary high frequency-compatible VCO circuits and construction details are described in *RF Circuit Design, Theory and Applications*, Ludwig, R. and P. Bretchko, Prentice Hall (2000). Presently preferred is a tuned-differential amplifier with the bases and collectors cross-coupled to provide positive feedback and a 360° phase shift. This tuned subcircuit is located in the collectors and is comprised of internal varactors and preferably an external inductance-providing tank circuit 42. External tank circuit 42 also provides DC bias for the VCO. Preferred here is an internal varactor diode configuration such that the VCO control input is inversely related to the output frequency.

Before being phase/frequency compared to driving signal 32, the analog controlled-frequency signal 40 is passed through frequency divider subcircuit 20. Frequency divider 20 produces a corresponding reduced-frequency feedback signal 34. Frequency divider 20 allows phase detector 14 to operate on oscillating signals with frequencies in the range of the fundamental mode frequency of quartz resonator 24.

The preferred divider circuit configuration relies on a series of flip-flops with a logic selection input for preselecting the divider ratio, though a variety of circuit arrangements are suitable for providing frequency divider 20.

Oscillator 10 includes translator subcircuit 22 to convert the preferably analog (i.e. sinusoidal) controlled-frequency signal 40 to a digital (or logic level) output signal 44. Translator subcircuit 22 is preferably a differential receiver (i.e. differential ECL driver) providing a digital output signal at voltage levels conventional for 10K or 100K positive-referenced emitter coupled logic (PECL), also called positive emitter-coupled logic (PECL). Other digital logic level output standards are also contemplated including signals oscillating between voltage levels conventional for a semiconductor circuit technology selected from the group consisting essentially of transistor-transistor logic, emitter coupled logic, CMOS, MOSFET, GaAS field effect, MESFET, HEMT or PHEMT, CML and LVDS.

The outline in FIG. 1 identified by reference numer 46 indicates which circuit elements are preferably integrated into a single semiconductor chip module. Preferably off-chip are the quartz resonator 24 and the circuit elements of the voltage variable capacitance 28, the loop filter 16, and the VCO tank circuit 42. Although the circuit elements of sinewave-to-logic level translator 22 are implemented using integrated circuit semiconductor technology (i.e. a chip), translator 22 is separate from module 46 to allow greater flexibility in specifying digital output standards and differing power supply voltages as discussed below.

Controllable oscillators according to the present invention are specially suited for operation at relatively high frequencies. For example, the circuit of FIG. 1 is specially suited for providing oscillators exhibiting output RMS phase jitter of less than about 5 picoseconds, Absolute Pull Range (APR) of at least ±50 ppm at nominal operating frequencies of 622.08, 644.531, 666.514 and 669.326 Megahertz.

Absolute Pull Range (APR) is defined as the controllable frequency deviation (specified in ±ppm) from the nominal frequency (F0) over a wide range of operating parameters, including frequency tolerance, frequency stability, supply voltage, output load, temperature and time (i.e. aging). Sustained output-frequency controllability over a range of temperatures is an important aspect of the APR definition. For the APR specification, the range of −40 to 85 degrees Celsius (°C.) is an accepted temperature range for testing temperature sensitivity.

EXAMPLE

A batch of controllable crystal oscillators 110 were fabricated according to an embodiment of the present invention. A simplified circuit schematic for the fabricated samples is presented in FIG. 2.

Figure 2:
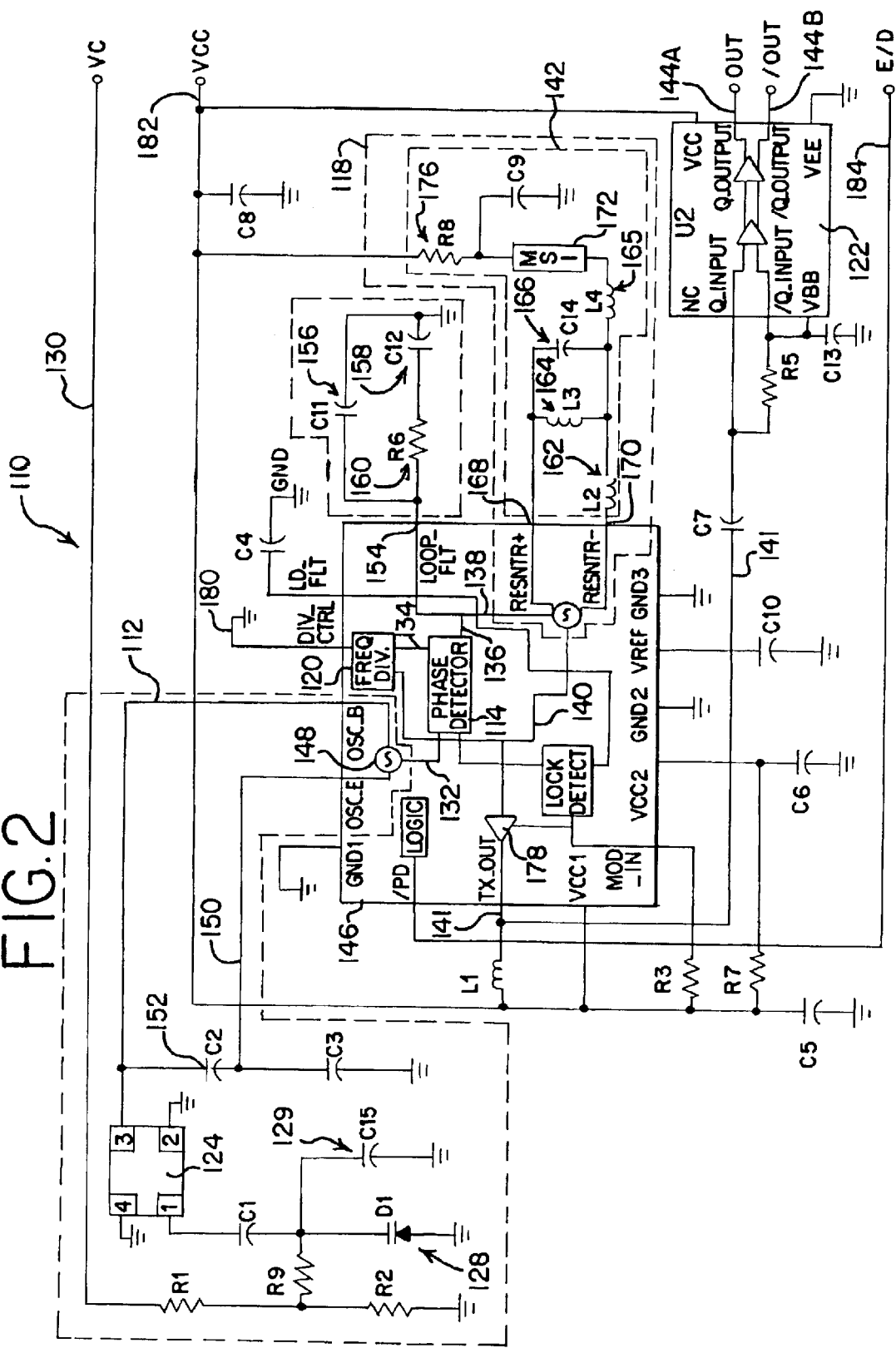
FIG. 2 is a simplified circuit diagram according to a preferred embodiment of this invention.

FIG. 2 represents the following subcircuits: crystal oscillator 112, phase detector 114, loop filter 116, voltage controlled oscillator (VCO) 118, frequency divider 120 and sinewave-to-logic level translator 122. In accordance with the preferred level of chip integration, phase detector circuit 114, frequency divider 120 and portions of crystal oscillator circuit 112 and VCO 118 are combined in chip module 146.

The presently preferred chip module is commercially available from RF Micro Devices (Greensboro, N.C.) under the designation "RF2514" and was used for this example.

Crystal oscillator circuit 112 is a Colpitts configuration including on-chip elements 148, a package crystal module 124, and a discrete varactor 128. Arranged in parallel with discrete varactor 128 is a fixed capacitor 129 (C15) for setting the overall load capacitance in the proper range. The bias DC voltage of varactor 128 is set by a control input 130. According to the Colpitts configuration, crystal oscillator circuit 112 includes a feedback loop 150 with capacitor 152 (C2).

The crystal resonator 124 is surface mountable and of the type commercially available from CTS Wireless Components (Bloomingdale, Ill.) under the designation ATXN6034A and adapted to resonate at 19.44 MHz under a 10 picofarad load.

Crystal oscillator circuit 112 provides a reference output 132 to the on-chip phase detector circuit 114. Chip module 146 includes a connection 154 (LOOP_FLT) for a loop filter 116. Loop filter 116 receives and integrates a frequency offset signal 136 from phase detector circuit 114. Loop filter 116 includes capacitors 156 (C11) and 158 (C12) and a resistor 160 (R6).

Loop filter 116 provides a VCO control signal 138 to voltage controlled oscillator circuit 118, which includes on-chip and discrete components. Preferably off-chip are discrete components forming a tank circuit 142: three inductors 162 (L2), 164 (L3), 165 (L4) and a capacitor 166 (C14), which are connected through 168 (RESNTR+) and 170 (RESNTR−) on module 146. Variable inductor 172 allows the VCO output center frequency to be tuned (or "trimmed") to offset unavoidable variations in the various VCO components. Variable inductor 172 preferably takes the form of a transmission line microstrip (MS1), also called a "laser paddle." VCO circuit 118 of module 146 receives a bias voltage through tank circuit 142 via a connection 174 with resistor 176 (R8)

VCO circuit 118 includes an on-chip output amplifier 178 for providing an isolated controlled frequency signal 141 (TX_OUT) in response to controlled frequency signal, which is represented symbolically with reference numer 140 in module 146.

Frequency divider 120 receives controlled frequency signal 140 and provides a reduced-frequency feedback signal 134. The divider ratio of frequency divider 120 is preselected by a setting a logic input 180 (DIV_CTRL). As shown, input 180 is connected to ground to create a logic low for setting module 146 to a divider ratio of 32 to 1 for this example.

Circuit 110 includes a sinewave-to-logic level translator 122 in the form of a differential receiver, which receives sinewave output signal 141. A preferred differential receiver is commercially available from Micrel Semiconductor (San Jose, Calif.) under the designation "SY10EP16V" and was used for this example. Also suitable is a chip module commercially available from Arizona Microtek (Mesa, Ariz.) under the designation "AZ100LVEL16." Differential receiver module 122 provides a digital output signal according to the 10K Positive Emitter Coupled Logic (PECL) standard: logical zero is in the range from about 1.49 volts to about 1.68 volts, logical one is in the range from about 2.28 volts to about 2.42 volts. These output levels are realized when the supply voltage to module 122 is about 3.3 volts. The PECL output is complementary requiring two terminals 144A (Q_OUTOUT) and 144B (/Q_OUTOUT).

Frequency controllable oscillator 110 demonstrates a preferred level of circuit integration. There is special advantage to a circuit integration scheme in which voltage controlled oscillator (VCO) 118 includes a non-integrated tank circuit 142. Also preferably off-chip are the circuit elements making up the loop-filter 116 and varactor 128.

Module 146 includes the following pin connections not yet otherwise identified: GND1, GND2, GND3, PD, VCC1, VCC2, MOD IN, VREF, LD_FLT. GND1 and GND3 are ground connections for use by the analog components of module 146. GND 2 is a ground connection for use with the digital elements of the phase detector and locking circuits. PD is a DC voltage on-off switch. VCC1 is a DC bias for amplifier 178. VCC2 a DC bias input connection for VCO 118. MOD IN is not used for oscillator 110. VREF is not used for the example except for providing a high Q filter. LD_FLT is a discrete filter connection for the phase detector circuit.

Circuit and package design for components having signals at radio frequency (RF) include a number of bypass capacitors to suppress parasitic signals which may be picked up on nearby circuit elements such as transistors and transmission lines. Oscillator 110 includes the following such filtering capacitors C3, C4, C5, C8, C9, C6, C10 and C13.

Figure 3:
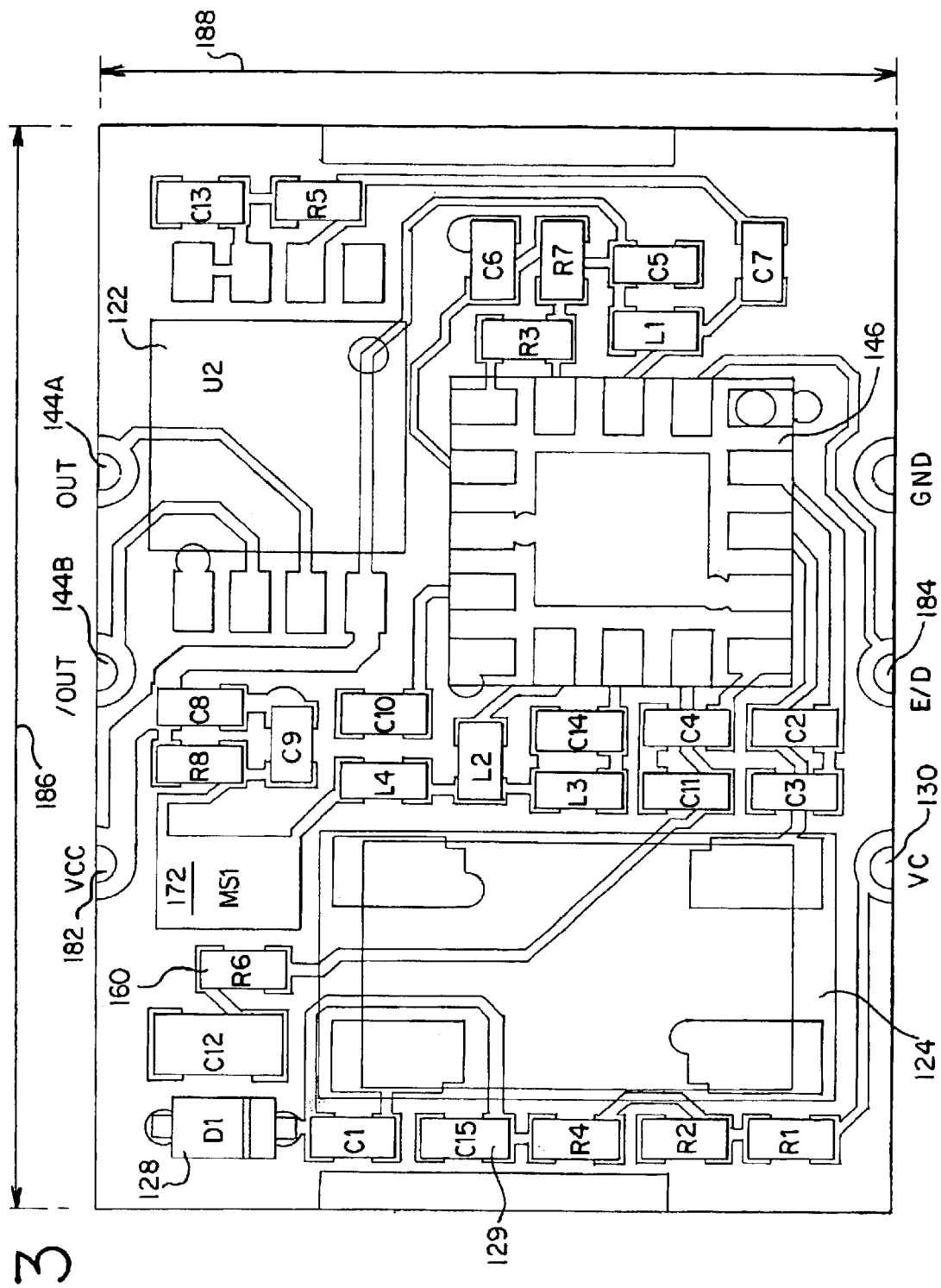
FIG. 3 is a circuit board layout for implementing the controllable oscillator shown in FIG. 2.

FIG. 3 is a circuit board layout utilized for this example to implement the circuit presented in FIG. 2. The layout of FIG. 3 allows oscillator 110 to be provided in a surface mount or pinned package having dimensions of about 14 mm long (reference 186) by 9.3 mm wide (reference 188) by at most about 2.4 mm tall. In packaged form, controllable crystal oscillator 110 includes connections for variable-voltage control input 130 (VC), a DC power input 182 (VCC), digital outputs 144A (OUT) and 144B (/OUT), and an on-off switch connection 184 (E/D), all of which are identified in FIG. 2 as well. Connection 184 (E/D) is linked to module 146 terminal PD. In this preferred embodiment, the minimum packaged height limitation is dictated by the circuit board thickness and crystal subpackage 124. This example, controllable crystal oscillator 110, is a particularly preferred embodiment of the present invention. Controllable crystal oscillator 110 includes an AT-cut crystal subpackage 124 adapted to operate in fundamental mode at 19.44 MHz together with a divider circuit 120 preset to divide feedback signal 140 by 32. Specifications for selected circuit elements shown in FIG. 2 are presented in TABLE I, below.

TABLE I

| Reference ID (from FIG. 2) | Specification |
|---|---|
| C1 | 160 pF |
| C2, C3 | 43 pF |
| C4 | 0.1 µF |
| C4, C5, C6, C7, C8, C9, C13 | 1000 pF |
| C7 | 3 pF |
| C10 | 0.01 µF |
| C11 | 220 pF |
| C12 | 0.22 µF |
| C14 | 1.2 pF |
| C15 | 2.7 pF |
| R1, R7 | 10 Ω |
| R2 | 100 KΩ |
| R3 | 47 KΩ |
| R5 | 51 Ω |
| R6 | 4.3 KΩ |
| R8 | 1.5 KΩ |
| R9 | 47 KΩ |
| L1 | 39 nH |

TABLE I-continued

| Reference ID (from FIG. 2) | Specification |
|---|---|
| L2 | 22 nH |
| L3 | 15 nH |
| L4 | optional |
| DC Supply VCC Range | 3.15–3.45 V |
| Control Input VC Range | 0.3 to 3.0 V |
| Target Load Impedance | 50 Ω |

The operating performance of controllable crystal oscillators 110 was measured over a range of voltages for voltage-variable control input 124. The results are presented in TABLE II, below.

TABLE II

| DC Voltage at Input 130 (DC Volts) | Digital Output 144A/B Frequency (MHz) |
|---|---|
| 0.15 | 621.9745 |
| 0.3 | 621.9782 |
| 0.45 | 621.9819 |
| 0.60 | 621.9858 |
| 0.75 | 621.9898 |
| 0.90 | 621.9941 |
| 1.05 | 621.9987 |
| 1.20 | 622.0037 |
| 1.35 | 622.0090 |
| 1.50 | 622.0148 |
| 1.65 | 622.0214 |
| 1.80 | 622.0285 |
| 1.95 | 622.0364 |
| 2.10 | 622.0450 |
| 2.25 | 622.0544 |
| 2.40 | 622.0640 |
| 2.55 | 622.0736 |
| 2.70 | 622.0831 |
| 2.85 | 622.0916 |
| 3.00 | 622.0993 |
| 3.15 | 622.1058 |

The data was recorded using an HP4396A Network/Spectrum Analyzer, available from Agilent Technologies, Inc. (Palo Alto, Calif.), at an uncontrolled (but substantially room) temperature with a load impedance of 50 ohms. FIG. 3 is a plot of this data demonstrating the relatively linearity of the operating relationship. As FIG. 3 and TABLE II reveal, the output operating frequency is selectable in the range from about 622,018 kilohertz to about 622,142 kilohertz. Also as shown, the output frequency (at 144) to control input voltage (at 130) operating has a best straight line nonlinearity of less than about 10 percent.

Figure 4:
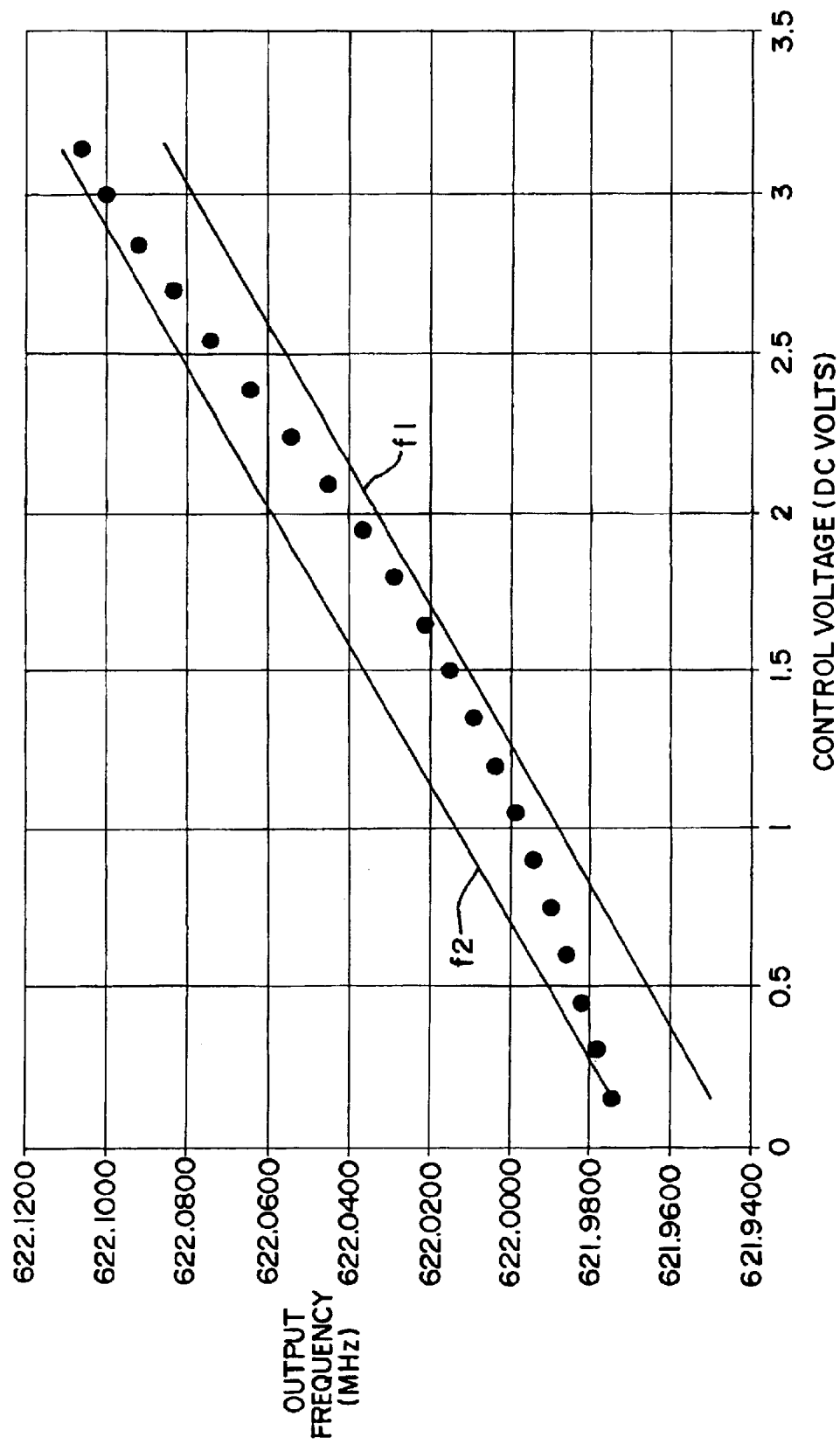
FIG. 4 is a graph of the operating curve for an oscillator fabricated according to the simplified circuit diagram of FIG. 2.

The test results can be characterized in that the operating digital output frequency of controllable oscillator 110 is within the area defined between the following two equations:

$$f1_{output} = 0.04526(V_{control}) + 621.9430 \text{ Megahertz}$$

$$f2_{output} = 0.04526(V_{control}) + 621.9679 \text{ Megahertz}$$

for $V_{control}$ values in the range of about 0.15 volts to about 3.15 volts, where $V_{control}$ is a DC voltage level of the voltage-variable input. FIG. 4 includes a plot of $f1_{output}$ and $f2_{output}$. Additional test results are summarized in TABLE III, below.

TABLE III

Output 144 Phase Jitter Performance

| type | peak to peak | RMS (1σ) |
|---|---|---|
| open loop | 40 picoseconds | 4 picoseconds |
| 12 kHz to 20 Mhz | 5 picoseconds | 0.5 picoseconds |

The rise and/or fall time for the PECL output did not exceed about 400 picoseconds.

Frequency controllable oscillator 110 has a supply DC power input 182 (VCC) operably and commonly linked to energize both module 146 and sinewave-to-logic level translator 122 at the same DC voltage level, e.g. about 3.3 Volts. An alternate embodiment includes a DC to DC regulator allowing module 146 and translator 122 to be powered at different voltage levels via a common voltage supply. For example, the supply DC input 182 (VCC) is about 5 volts with translator 122 being powered at about 5 volts and module 146 is powered at about 3.3 volts via a regulator operating on the 5 volt supply input.

This invention offers several key features in oscillator design. Oscillators of this invention provide a voltage adjustable, relatively high frequency (>500 MHz) digital output signal utilizing lower-cost conventional quartz resonators. Overall package size is reduced by a special inventive combination of integrated circuits and performance enhancing discrete components.

Alternate Embodiments with Enhanced Temperature Tolerance

Figure 5:
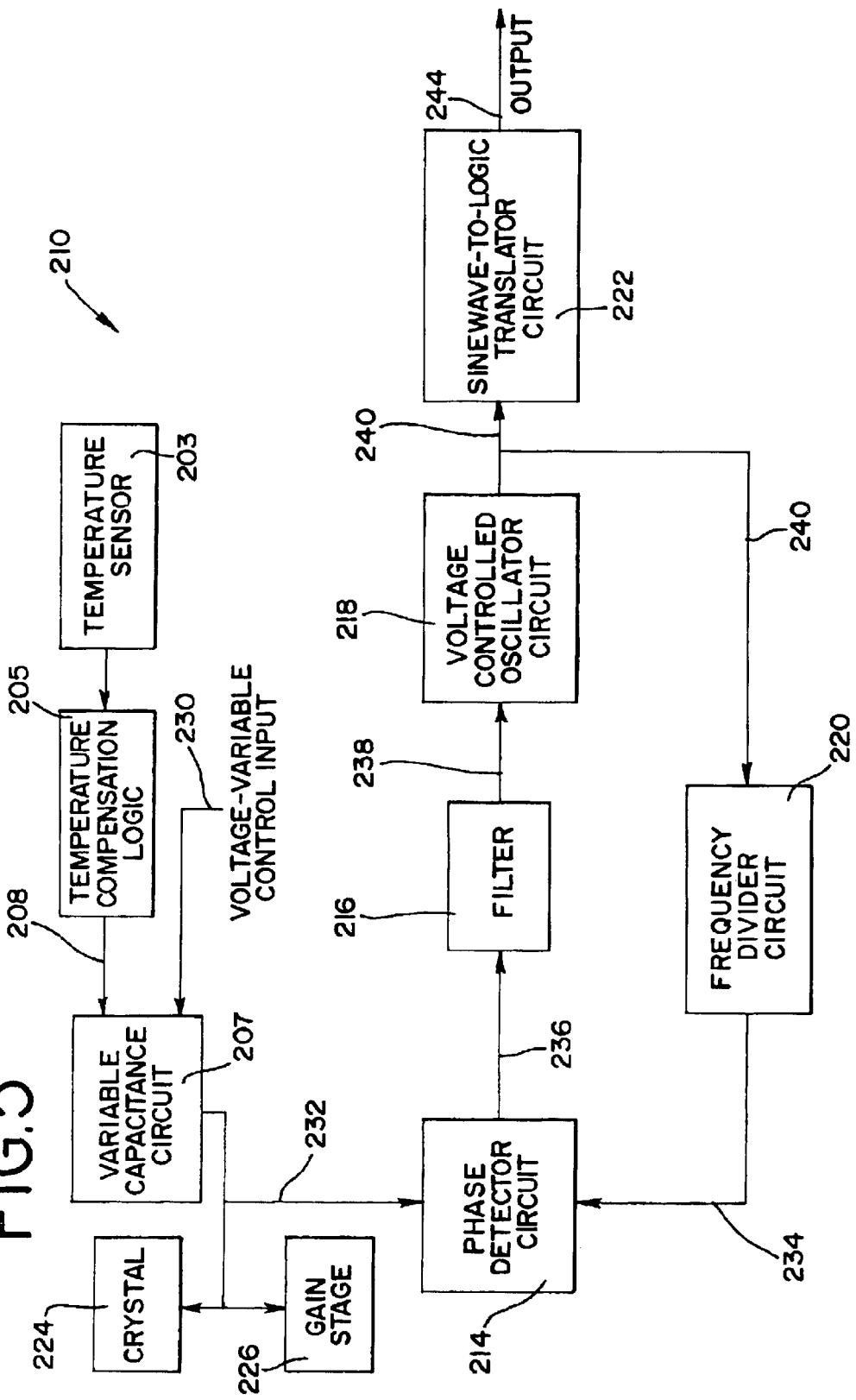
FIG. 5 is a schematic diagram of a controllable oscillator according to an alternate embodiment of this invention that includes temperature compensation.

Illustrated schematically in FIG. 5 is an oscillator 210 with enhanced tolerance for variations in operating temperature. The oscillating frequency of quartz crystals is temperature dependant—the sensitivity varying according to crystal cut and crystal quality generally. A preferred embodiment of this invention includes temperature compensation such that the crystal oscillator circuit can be digitally calibrated to correct for temperature effects.

Turning to FIG. 5, a frequency controllable oscillator 210 includes a temperature sensor 203, a temperature compensation logic 205, a variable capacitance circuit 207, a resonator gain stage 226, a quartz resonator 124, a phase detector circuit 214, a loop filter 216, a voltage controlled oscillator (VCO) circuit 218, a frequency divider circuit 20, and a sinewave-to-logic level translator circuit 222.

Quartz resonator 224 is energized for oscillation by gain stage 226. The frequency of this quartz resonator-based oscillation is adjustable by a variable capacitance circuit 207, which adjusts the overall reactive/capacitive load. Variable capacitance circuit 207 is responsive to two adjustment signals, a capacitance adjustment signal 208 generated by temperature compensation logic 205 and a control input 230 for external frequency control.

Variable capacitance subcircuit 228 preferably includes at least one discrete variable capacitance diode (i.e. a varactors) operably linked to control input 230 and a second variable capacitance element in the form of a bank of transistor-switchable capacitors and on-chip varactors in a parallel circuit configuration as described above in reference to variable capacitance element 28 (for oscillator 10). The second variable capacitance element is responsive to capacitance adjustment signal 208.

Other configurations for variable capacitance circuit 228 are contemplated. For increased on-chip integration, both control input 230 and capacitance adjustment 208 are served by a bank of transistor-switchable capacitors and/or transistor-switchable on-chip varactors together with allocation logic for merging the desired capacitance adjustment from each adjustment signal.

Capacitance adjustment signal 208 is generated by temperature compensation logic 205 with temperature sensor 203. Temperature compensation logic 205 includes a memory (e.g. EEPROM) with information characterizing the temperature dependency of quartz resonator 224. More specifically, temperature compensation logic 205 is factory programmed with digital data which substantially corresponds to an inverse function of the frequency deviations of quartz resonator 224 over temperature. For an AT-cut crystal, which is preferred, the inverse function corresponds to the Bechmann curve, which can be well approximated by a third or higher order polynomial expansion. A fourth order expansion is preferred for its additional accuracy.

In operation, the polynomial coefficients of the Bechmann curve are calculated for each quartz resonator 224 and these values are programmed into memory. Alternatively, the memory is programmed with a table of actual frequency deviations of quartz resonator 224 over discrete temperature ranges which may be called up and applied to variable capacitance circuit 207.

In the preferred embodiment, temperature sensor 203 is an chip-integrated cascaded diode string located near quartz resonator 224, though a thermistor or appropriately scaled transistor are also suitable. Temperature sensor 203 provides a temperature indicating signal to compensation logic 205 where temperature changes are translated into the necessary capacitance adjustment to block any temperature-related frequency variance.

The resulting driving signal 232 is received by phase detector (or phase comparator) circuit 214 and compared to a reduced frequency feedback 234 signal from divider circuit 220. Phase detector 214 produces a phase offset signal 36 having a DC voltage level proportional to the phase difference between reduced frequency feedback signal 234 and driving signal 232.

The detailed description of phase detector circuit 14, loop filter 16, voltage controlled oscillator (VCO) 18, frequency divider 20, and translator 22 of oscillator 10 presented above applies equally to phase detector circuit 214, loop filter 216, voltage controlled oscillator (VCO) 218, frequency divider 220, and translator 222 of oscillator 210.

Loop filter 216 is operably linked between phase detector 214 and voltage controlled oscillator (VCO) 218 for stripping high frequency components from the VCO control signal. Voltage controlled oscillator (VCO) 218 is responsive to changes in the DC voltage level of a VCO control signal 238. VCO 218 provides a resulting analog controlled-frequency signal 240. Loop filter 216 integrates pulses received from phase detector 214 to create a control voltage at VCO control signal 238.

The analog controlled-frequency signal 240 is passed through frequency divider subcircuit 220 to produce a corresponding reduced-frequency feedback signal 234. Frequency divider 220 allows phase detector 214 to operate on oscillating signals with frequencies in the range of the fundamental mode frequency of quartz resonator 224.

As described above for oscillator 10, oscillator 210 includes translator subcircuit 222 to convert the sinusoidal controlled-frequency signal 240 to a logic level output signal 244.

Figure 6:
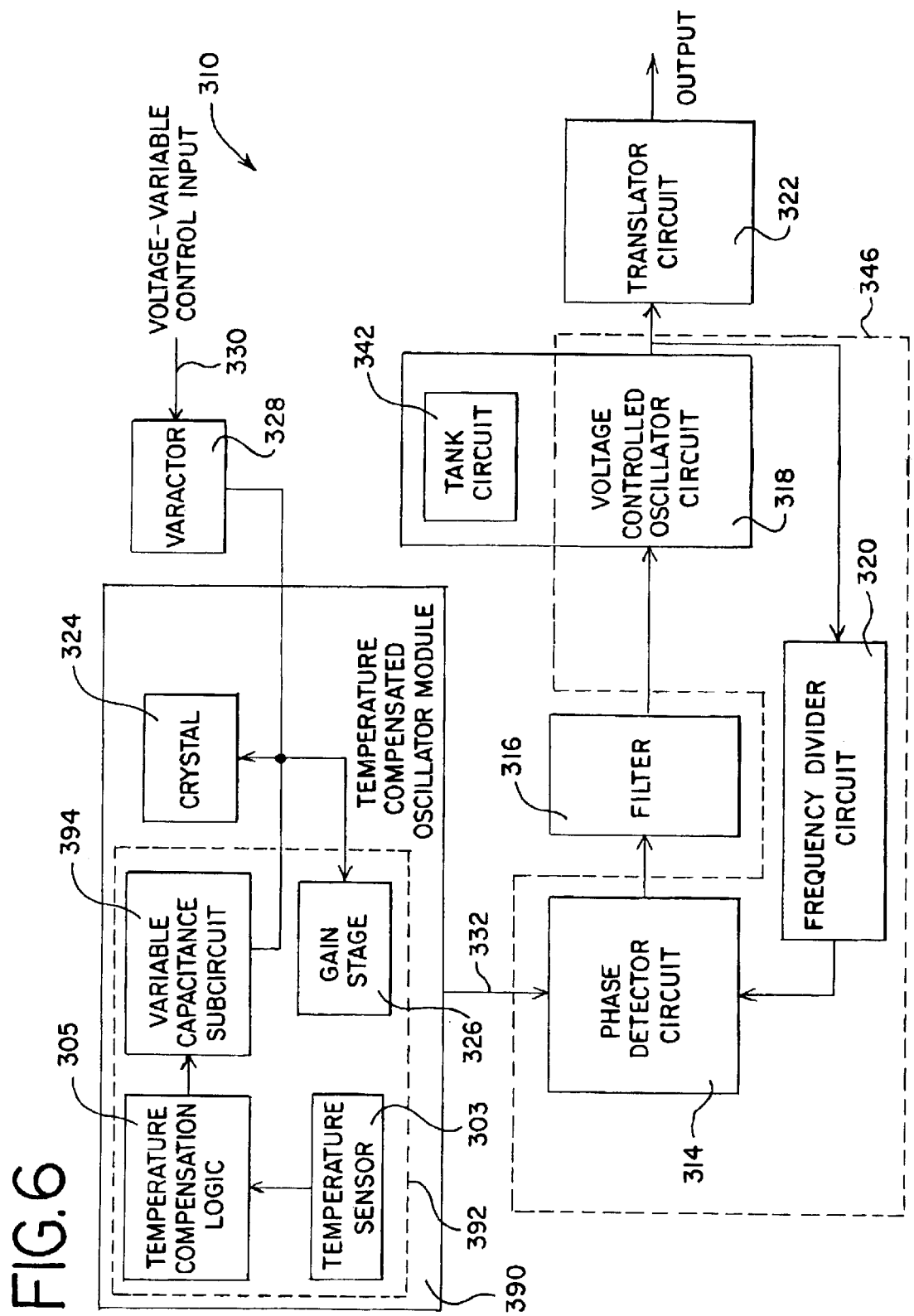
FIG. 6 is a schematic diagram of a controllable oscillator according to an alternate temperature compensated embodiment of this invention.

As discussed above, contemplated herein are a number of design variations for allocating the required load capacitance adjustment among external control 230 and temperature compensation 205. Referring to FIG. 6 for another example.

A frequency controller 310 utilizes a discrete varactor 328 responsive to input 330 for external frequency control and a packaged temperature compensated crystal oscillator module 390, which includes variable capacitance for temperature compensation. Module 390 includes a crystal resonator 324 and an integrated circuit 392. Integrated circuit 392 combines on-chip variable capacitance elements 394, temperature sensor 303, temperature compensation logic 305 and crystal gain stage 326.

The resulting driving signal 332 and the other elements of oscillator 310, namely—phase detector circuit 314, loop filter 316, voltage controlled oscillator (VCO) circuit 318, frequency divider 320, and translator 322 are as described above for oscillators 10 and 210, above. The dashed-outline 346 in FIG. 6 demonstrates the favored level of integration. Phase detector elements 314, frequency divider elements 320 and portion of the voltage controlled oscillator (VCO) 318 are integrated. Preferably off-chip are the loop filter 316 and the VCO tank circuit 342.

Example Oscillator with Reduced Temperature Variation

Figure 7:
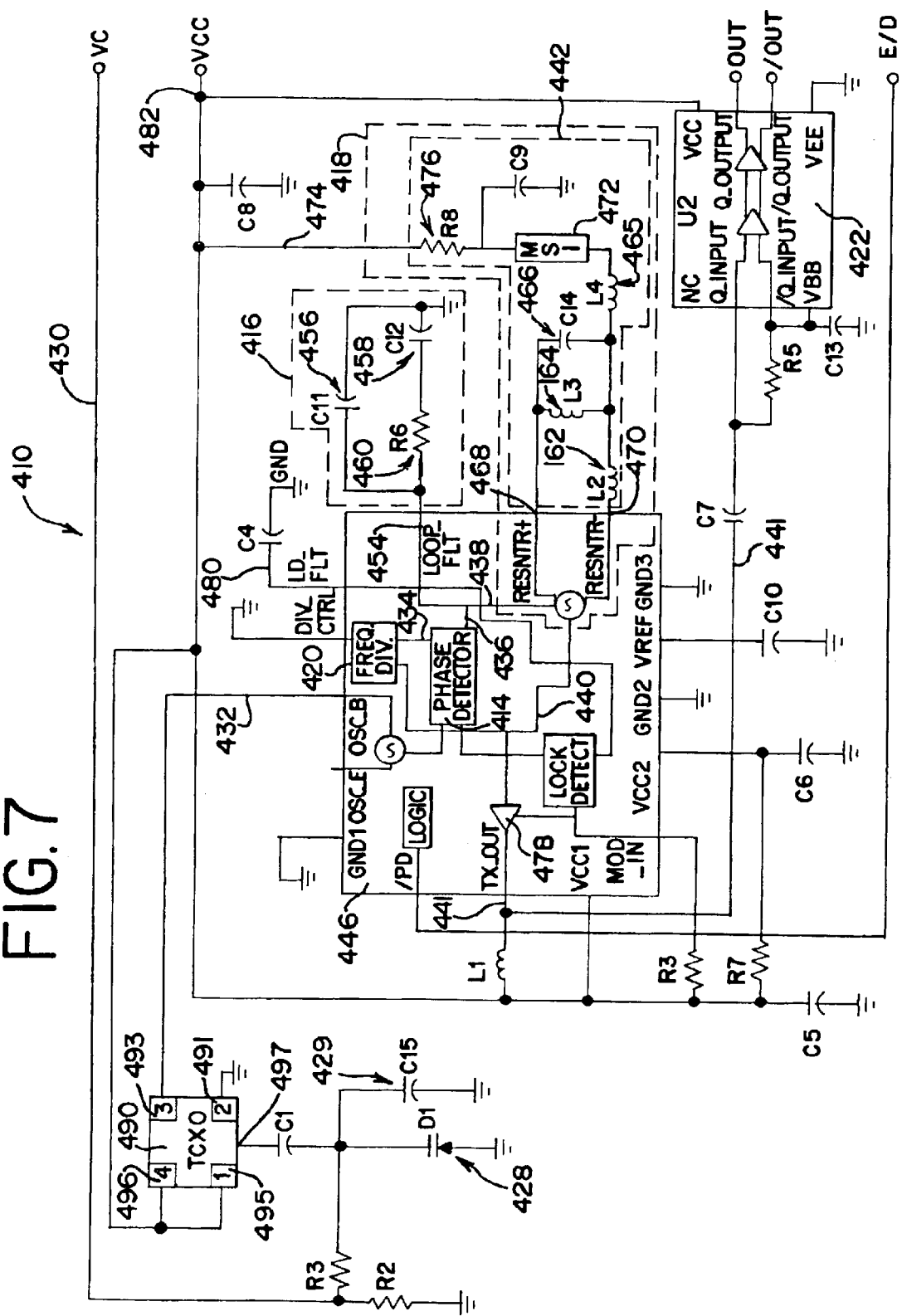
FIG. 7 is a simplified circuit diagram according to an alternate preferred embodiment of this invention.

Referring to the simplified circuit diagram of FIG. 7, a controllable crystal oscillator 410 utilizes a temperature compensated crystal oscillator module 490.

Oscillator 410 is surface mountable includes a temperature compensated crystal oscillator subpackage (TCXO) 490, a phase detector 414, a loop filter 416, a voltage controlled oscillator (VCO) 418, a frequency divider 420 and a sinewave-to-logic level translator 422. Phase detector circuit 414, frequency divider circuit 420 and portions of VCO 418 are combined in chip module 446. The presently favored chip module is commercially available from RF Micro Devices (Greensboro, N.C.) under the designation "RF2514" and was used for this example.

Temperature compensated crystal oscillator 490 is of the type commercially available from CTS Wireless Components (Bloomingdale, Ill.) under the designation OSC1625A, which was used for this example. TCXO 490 is a surface mountable subpackage with dimensions 3.2 mm wide by 5.0 mm long by 1.5 mm high. It has four surface mount connections: ground 491, output 493, supply power 495, and logic control 496. The package has additional operably links (or connections) via side castellations, including a connection 497 for direct access to the crystal resonator therein.

Operably linked to the crystal via connection 497 is discrete varactor 428 and an additive fixed capacitor 429 (C15) for setting the overall load capacitance in the proper range. The bias DC voltage of varactor 428 is set by control input 430. TCXO 490 with varactor 428 provide a driving signal 432 to module 446 and the on-chip phase detector circuit 414 therein. Chip module 446 includes a connection 454 (LOOP_FLT) for a loop filter 416. Loop filter 416 receives and integrates a frequency offset signal 436 from phase detector circuit 414. Loop filter 416 includes capacitors 456 (C11) and 458 (C12) and a resistor 460 (R6).

Loop filter 416 provides a VCO control signal 438 to voltage controlled oscillator circuit 418, which includes on-chip and discrete components. Preferably off-chip are discrete components forming a tank circuit 442: three inductors 462 (L2), 464 (L3), 465 (L4) and a capacitor 466 (C14), which are connected through 468 (RESNTR+) and 470 (RESNTR−) on module 446. Variable inductor 472 allows the VCO output center frequency to be tuned to offset unavoidable variations in the various VCO elements. Variable inductor 472 preferably takes the form of a transmission line microstrip (MS1). VCO circuit 418 of module 446 receives a bias voltage from supply 482 through tank circuit 442 via a connection 474 with resistor 476 (R8).

VCO circuit 418 includes an on-chip output amplifier 478 for providing an isolated controlled frequency signal 441 (TX_OUT) in response to controlled frequency signal 440.

Frequency divider 420 receives controlled frequency signal 440 and provides a reduced-frequency feedback signal 434. The divider ratio of frequency divider 420 is preselected by a setting a logic input 480 (DIV_CTRL). Input 480 is connected to ground to create a logic low for setting module 446 to a divider ratio of 32 to 1 for this example. Sinewave-to-logic level translator 422 (a differential receiver) receives sinewave output signal 441. A preferred differential receiver is commercially available from Micrel Semiconductor (San Jose, Calif.) under the designation "SY10EP16V" and was used for this example. Differential receiver module 422 provides a digital output signal according to the 10K Positive Emitter Coupled Logic (PECL) standard (described above). The PECL output is complementary output requiring two terminals 444A (Q_OUTOUT) and 444B (/Q_OUTOUT).

As discussed above with reference to FIG. 2, practical RF circuits include bypass capacitors to suppress parasitic signals which may be picked up on nearby circuit elements such as transistors and transmission lines. Oscillator 410 includes the following by-pass capacitors C4, C5, C6, C8, C9, C10 and C13.

Specifications for selected circuit elements shown in FIG. 7 are presented below in TABLE IV.

TABLE IV

| Reference ID (from FIG. 7) | Specification |
|---|---|
| C1 | 10000 pF |
| C4, C5, C6, C7, C8, C9, C13 | 1000 pF |
| C7 | 3 pF |
| C10 | 0.01 µF |
| C11 | 220 pF |
| C12 | 0.22 µF |
| C14 | 1.2 pF |
| C15 | 2.2 pF |
| R1, R7 | 10 Ω |
| R2 | 100 KΩ |
| R3 | 47 KΩ |
| R5 | 51 Ω |
| R6 | 4.3 KΩ |
| R8 | 1.5 KΩ |
| R9 | 47 KΩ |
| L1 | 39 nH |
| L2 | 22 nH |
| L3 | 15 nH |
| L4 | optional |
| DC Supply VCC Range | 3.15–3.45 V |
| Control Input VC Range | 0.3 to 3.0 V |
| Target Load Impedance | 50 Ω |

Packaged Oscillator Embodiment

FIG. 8 is a schematic cross-sectional view of a packaged oscillator embodiment of the present invention. A voltage controlled crystal oscillator 1100 includes a double-sided package with a platform 1102, a wall 1106, an upper (or first) cavity 1110, a lower (or second) cavity 1108, a cover 1112, and a laminated substrate in the form of a circuit board 1170. Platform 1102 has an upper surface 1102a, a lower surface 1102b, and a central portion and an outer portion 1102c. Platform 1102 is configured to pass a first signal between the upper surface 1102a and the lower surface 1102b. Lower surface 1102b is configured to receive a first component such as, but not limited to, a chip module 1156 (identified in FIG. 1 with reference numeral 46).

Circuit board 1170 has an upper surface 1170a and a lower surface 1170b. Upper surface 1170a is configured to receive additional components. These include, but are not limited to, a voltage variable capacitive element in the form of a discrete varactor 1158 (identified in FIG. 1 with reference numeral 28), a tank 1164 (in FIG. 1 as 42), a translator IC 1162 (in FIG. 1 as 22) and chip capacitors (not separately shown).

Oscillator 1100 includes an upwardly extending sidewall (or wall portion) 1106a, a downwardly extending sidewall (or lower portion) 1106b, a sidewall bottom 1106c, and a sidewall top 1106d. Upper portion 1106a and lower portion 1106b are separated by platform 1102. Bottom 1106c is configured to pass a second signal between wall 1106 and circuit board 1170. Cover 1112 is affixed to the upper portion 1106a of the wall 1106.

Lower cavity 1108 is defined by lower surface 1102b of platform 1102, lower portion 1106b of wall 1106, and upper surface 1170a of circuit board 1170. Lower cavity 1108 is configured to receive and interconnect components. Upper cavity 1110 is defined by upper surface 1102a of platform 1102, upper portion 1106a of wall 1106, and cover 1112. Upper cavity 1110 is hermetically sealed and is configured to receive an AT-cut quartz crystal resonator 1150. The platform 1102 helps to isolate the lower and upper cavities 1108 and 1110 and the components within cavities 1108 and 1110, thereby minimizing the possibility of contamination by providing a hermetically sealed resonator 1150 that can be processed separately before the electronic components in the lower cavity 1108.

Oscillator 1100 has a substantially planar platform 1102. The platform 1102 has an upper surface 1102a, a lower surface 1102b, and an outer portion 1102c. Extending substantially upward and downward from outer portion 1102c are upper portion 1106a and lower portion 1106b of wall 1106. Upper surface 1102a of platform 1102, upper portion 1106a of wall 1106, and cover 1112 form a substantially rectangular upper cavity 1110 adapted to receive resonator 1150.

Lower surface 1102b of platform 1102, lower portion 1106b of wall 1106, and circuit board 1170 form lower cavity 1108. Lower cavity 1108 is adapted to receive a plurality of electronic components.

Oscillator 1100 geometry (or form) can vary widely. In an embodiment, oscillator 1100 is substantially portable and rectangular or square, and is adapted for placement in an electronic device taking up a small volume of the overall volume of the electronic device. Moreover, oscillator 1100 is adapted for mass production and miniaturization. For example, oscillator 1100 preferably has a footprint of approximately 5×7 millimeters (mm) or smaller. Likewise, oscillator 1100 preferably has a footprint of an area less than about 40 square millimeters (mm$^2$).

Oscillator 1100 preferably is made of materials having substantially similar thermal expansion coefficients to minimize stresses within the package. In an embodiment, platform 1102 and downwardly extending sidewall 1106b are made of a multi-layer co-fired ceramic material, such as alumina. Specifically preferred are co-fired ceramic materials such as alumina, produced for example through various casting or pressing techniques and having refractory, thick film or thin film metallizations, are suitable materials for platform 1102 and sidewall 1106b. These materials are preferred, but it is known in the art that many other materials of construction exist that may also perform satisfactorily, as do many processing techniques.

Upwardly extending sidewall 1106a preferably comprises a metal or metal alloy of tungsten, nickel, iron and cobalt. Alloys of nickel, iron and cobalt available from Carpenter Technology (Reading, Pa.) under the commercial designation "KOVAR." KOVAR's coefficient of thermal expansion is substantially similar to the preferred ceramic material of platform 1102 and sidewall 1106b.

A plurality of internal leads 1114 (shown symbolically as dashed lines in FIG. 8) are included for intercoupling among electrical component(s) and resonator 1150. The plurality of leads 1114 are coupled to a plurality of respective electrical contacts located at the bottom 1106d of wall 1106. Preferably, bottom 1106d of wall 1106 is substantially planar for providing contact to circuit board 1170. Internal leads 1114 are formed over platform 1102 and lower portion 1106b of walls 1106. Leads 1114 provide electrical paths from the resonator 1150 and components mounted on the lower surface 1102b of the platform 1102 to the bottom 1106c of the wall 1106. Leads 1114 include, but are not limited to, metallization trace patterns on layers of ceramic that make up the ceramic package as well as co-fired vias between layers. Oscillator 1100 optionally includes plated half holes, called castellations, on the outside of downwardly extending sidewall 1106b. Such castellations facilitate inspection and testing of the electrical connections 1122 (typically solder) between the contacts and the circuit board 1170.

Lower cavity 1108 is adapted to receive and interconnect an application specific integrated circuit (ASIC), such as chip module 1156 (identified in FIG. 1 with reference number 46), coupled to the platform 1102. The ASIC can have various structures, but is preferably, a wire bonded integrated circuit including a glob top, a flip chip integrated circuit including an organic underfill, or an integrated circuit adapted for making a gold-to-gold interface. The ASIC is preferably a flip-chip that is solder reflowed onto a metalized portion in proximity to the central portion of the platform 1102 such that the solder forms the electrical and mechanical connection of the ASIC and platform 1102. In a most preferred embodiment, the ASIC is a flip chip integrated circuit also including an organic underfill 1168 for better mechanically coupling the ASIC to the platform 1102 and for reducing the possibility of contamination to the ASIC.

FIG. 9 is a schematic view of lower surface 1102b in cavity 1108. More specifically, FIG. 9 includes a view of platform lower surface 1102b absent electronic components to show exemplary connection pads for testing and component mounting. Preferably present on lower surface 1102b, cavity 1108 includes a pair of tuning contacts 1131 and 1132 conductively linked to resonator 1150 for tuning. Also present on lower surface 1102b are a plurality of contacts 1133 for ASIC surface mounting.

Upper cavity 1110 is configured to receive resonator 1150. Resonator 1150 is preferably an AT-cut quartz crystal as described above for FIG. 1. Upper cavity 1110 may hold additional components. However, having the resonator 1150 isolated from some other components diminishes the possibility of contaminating the resonator 1150. More particularly, isolating and physically separating the resonator 1150 in the upper cavity 1110 from the components in the lower cavity 1108 reduces the possibility of solder, organic underfill, and other unwanted contaminants adversely affecting the output frequency of the resonator 1150.

Cover 1112 is complimentary configured to be received, and coupled to, upwardly extending sidewalls 1106a of the wall 1106, and specifically to upwardly extending sidewall 1106d. Cover 1112 can be affixed in many ways including, but not limited to, being seam welded or solder sealed to the upper portion 1106a of the wall 1106. Cover 1112 is affixed to the upwardly extending sidewall 1106a in a manner that provides a hermetic seal. Cover 1112 may be formed from many materials known to those having ordinary skill in the art including, but not limited to, a metal and a metal alloy such as KOVAR, KOVAR being presently preferred.

Resonator 1150 is positioned on, and coupled to, couplings 1118. Couplings 1118 provide mechanical and electrical connections to the resonator 1150. Electrically connected to couplings 1118 are leads, which are identified symbolically with reference number 1120. Couplings 1118 are a conductive compliant material such as, but not limited to, silver epoxy and silver-filled silicone. Leads 1120 are preferably, but are not limited to, tungsten filled vias. Leads 1120 connect the resonator 1150 to the circuitry in lower cavity 1108 and other circuitry such as circuitry mounted on circuit board 1170. Coupling 1118 includes a wrap-around section 1152 for operably electrically connecting the resonator 1150 with leads 1120.

Downwardly extending sidewall 1106b may be coupled to the circuit board 1170 in a variety of manners known to those having ordinary skill in the art. Sidewall bottom 1106c is configured to facilitate placement on a circuit board 1170 or similar substrate. The plurality of contacts are suitably connected to respective leads 1114, and to metallized paths on circuit board 1170.

Circuit board 1170 provides a planar upper (or cavity-facing) surface 1170a and a planar lower (or outward facing) surface 1170b. Upper surface 1170a has electrical component(s) attached thereto.

Circuit board 1170 is configured to be coupled to lower cavity 1108, and specifically to downwardly extending sidewall 1106c. Circuit board 1170 may be, but is not limited to, a multi-layered printed circuit board (e.g., four layers). For space conservation, inductors utilized for tank circuit 42 (FIG. 1) are optionally buried within the layers of board 1170. Circuit board 1170 optionally includes plated half-holes 1172, sometimes referred to as castellations, for providing electrical paths to and from the circuitry of the oscillator 1100. Lower surface 1170b of the circuit board 1170 includes conductive pads 1174 to facilitate oscillator 1100's electrical surface mountable connection to an electrical device.

Oscillator 1100 is fabricated by the following steps: (1) providing a platform 1102 and a wall 1106; (2) dispensing a silver epoxy on a central portion of platform 1102 to receive the crystal; (3) mounting an AT-cut quartz crystal 1150 on platform 1102; (4) dispensing a silver epoxy on a top portion of crystal 1150 for providing wrap-around connection 1152; (5) curing the silver epoxy in an oven for an appropriate period of time; (6) tuning quartz crystal 1150 by mass loading adjustment, while actuating via contacts 1131 and 1132; (7) sealing upper cavity 1110 by placing and sealing cover 1112 with a seam weld; (8) mounting electrical component(s), such as one or more ASICs, on lower surface 1102b of lower cavity 1102b; (9) providing a printed circuit board 1170 having a first surface 1170a with interconnections and contacts for receiving additional components and connection to surface 1106c of downwardly extending sidewalls 1106b and a lower surfaceide surface mount contacts 1174; (10) mounting additional electrical component(s) onto upper surface 1170a of circuit board 1170; (11) attaching circuit board 1170 to bottom 1106c of downwardly extending sidewall 1106c; (15) form castellations on circuit board 1170.

Placing additional electrical component(s) on lower surface 1102b may include epoxy encapsulating and/or underfilling first electrical component(s). Crystal resonator 1150 is preferably tunable. Accordingly, lower cavity 1108 includes accessible conductive pads 1131 and 1132 (FIG. 9) for actuating crystal 1150 during the frequency tuning step. The tuning step may include adding metal to (or subtracting metal from) electrode 1190 (FIG. 10).

Numerous variations and modifications of the embodiments described above may be effected without departing from the spirit and scope of the novel features of the invention. No limitations with respect to the specific system illustrated herein are intended or should be inferred. It is, of course, intended to cover by the appended claims all such modifications as fall within the scope of the claims.

We claim:

1. A frequency-adjustable oscillator suitable for digital signal clock synchronization, the oscillator comprising:
    a crystal oscillator circuit for generating a driving signal and having a voltage-variable control input for adjusting a frequency of the driving signal, the crystal oscillator circuit including a voltage variable capacitive element responsive to the control input, an AT-cut quartz resonator operably linked to the voltage variable capacitive element, and a gain stage for energizing the quartz resonator;
    a phase detector circuit for generating a phase offset signal;
    a filter which operates on the phase offset signal to produce a VCO control signal;
    a voltage controlled oscillator circuit operably linked to the filter and responsive to the VCO control signal for generating an analog controlled-frequency signal;
    a frequency divider circuit having a preselected divider ratio operably linked between the voltage controlled-frequency oscillator circuit and the phase detector circuit for generating a reduced frequency feedback signal in response to the controlled-frequency signal,
    the phase detector circuit being responsive to the feedback signal and the driving signal such that the phase offset signal varies according to a phase difference between the feedback signal and the driving signal;
    a double-sided package including a platform having a central portion and an outer portion, sidewalls extending substantially upwardly and substantially downwardly from the outer portion of the platform;
    the upwardly extending sidewalls and the platform forming a first cavity adapted to receive and electrically connect the quartz resonator;
    the downwardly extending sidewalls and the platform forming a second cavity adapted to receive and electrically connect at least one electronic component;
    a cover coupled with the first cavity defining a hermetic environment for containing the quartz resonator; and
    a sinewave-to-logic level translator circuit operably linked to the voltage controlled oscillator for generating a digital output signal responsive to the controlled-frequency signal, wherein the translator circuit is a differential receiver adapted to generate the digital output signal at voltage levels conventional for positive-referenced emitter coupled logic (PECL).

2. The oscillator according to claim 1 wherein the voltage variable capacitive element includes a discrete varactor received in the second cavity and operably linked to the quartz resonator.

3. The oscillator according to claim 1 wherein the voltage controlled oscillator circuit is resident on an electronic component received in the second cavity.

4. The oscillator according to claim 1 wherein the following elements are received in said second cavity the gain stage,
    the phase detector circuit, the voltage controlled oscillator circuit, and
    the frequency divider circuit.

5. The oscillator according to claim 1 wherein the following elements are integrated in a single semiconductor chip received in said second cavity:
    the gain stage,
    the phase detector circuit,
    the voltage controlled oscillator circuit, and
    the frequency divider circuit.

6. The oscillator according to claim 1 further comprising a laminate substrate coupled with the second cavity.

7. The oscillator according to claim 6 wherein said platform has a second-cavity side, and at least one electronic component is mounted on the second-cavity side and at least one electronic component is mounted on said laminate substrate.

8. A frequency-adjustable oscillator suitable for digital signal clock synchronization, the oscillator comprising:
    a crystal oscillator circuit for generating a driving signal and having a voltage-variable control input for adjusting a frequency of the driving signal, the crystal oscillator circuit including a voltage variable capacitive element responsive to the control input, an AT-cut quartz resonator operably linked to the voltage variable capacitive element, and a gain stage for energizing the quartz resonator;
    a phase detector circuit for generating a phase offset signal;
    a filter which operates on the phase offset signal to produce a VCO control signal;
    a voltage controlled oscillator circuit operably linked to the filter and responsive to the VCO control signal for generating an analog controlled-frequency signal;
    a frequency divider circuit having a preselected divider ratio operably linked between the voltage controlled-frequency oscillator circuit and the phase detector circuit for generating a reduced frequency feedback signal in response to the controlled-frequency signal,
    the phase detector circuit being responsive to the feedback signal and the driving signal such that the phase offset signal varies according to a phase difference between the feedback signal and the driving signal;
    a double-sided package including a platform having a central portion and an outer portion, sidewalls extending substantially upwardly and substantially downwardly from the outer portion of the platform;
    the upwardly extending sidewalls and the platform forming a first cavity adapted to receive and electrically connect the quartz resonator;
    the downwardly extending sidewalls and the platform forming a second cavity adapted to receive and electrically connect at least one electronic component;
    a cover coupled with the first cavity defining a hermetic environment for containing the quartz resonator; and
    a laminate substrate coupled with the second cavity, wherein the laminate substrate includes a side castellation.

9. A frequency-adjustable oscillator suitable for digital signal clock synchronization, the oscillator comprising:
    a crystal oscillator circuit for generating a driving signal and having a voltage-variable control input for adjusting a frequency of the driving signal, the crystal oscillator circuit including a voltage variable capacitive element responsive to the control input, an AT-cut quartz resonator operably linked to the voltage variable capacitive element, and a gain stage for energizing the quartz resonator;

a phase detector circuit for generating a phase offset signal;

a filter which operates on the phase offset signal to produce a VCO control signal;

a voltage controlled oscillator circuit operably linked to the filter and responsive to the VCO control signal for generating an analog controlled-frequency signal;

a frequency divider circuit having a preselected divider ratio operably linked between the voltage controlled-frequency oscillator circuit and the phase detector circuit for generating a reduced frequency feedback signal in response to the controlled-frequency signal;

the phase detector circuit being responsive to the feedback signal and the driving signal such that the phase offset signal varies according to a phase difference between the feedback signal and the driving signal;

a double-sided package including a platform having a central portion and an outer portion, sidewalls extending substantially upwardlyand substantially downwardly from the outer portion of the platform;

the upwardly extending sidewalls and the platform forming a first cavity adapted to receive and electrically connect the quartz resonator;

the downwardly extending sidewalls and the platform forming a second cavity adapted to receive and electrically connect at least one electronic component;

a cover coupled with the first cavity defining a hermetic environment for containing the quartz resonator; and a laminate substrate coupled with the second cavity, wherein the laminate substrate is multi-layered and includes a buried inductor.

10. A frequency-adjustable oscillator suitable for digital signal clock synchronization, the oscillator comprising:

a crystal oscillator circuit for generating a driving signal and having a voltage-variable control input for adjusting a frequency of the driving signal, the crystal oscillator circuit including a voltage variable capacitive element responsive to the control input, an AT-cut quartz resonator operably linked to the voltage variable capacitive element, and a gain stage for energizing the quartz resonator;

a phase detector circuit for generating a phase offset signal;

a filter which operates on the phase offset signal to produce a VCO control signal;

a voltage controlled oscillator circuit operably linked to the filter and responsive to the VCO control signal for generating an analog controlled-frequency signal;

a frequency divider circuit having a preselected divider ratio operably linked between the voltage controlled-frequency oscillator circuit and the phase detector circuit for generating a reduced frequency feedback signal in response to the controlled-frequency signal;

the phase detector circuit being responsive to the feedback signal and the driving signal such that the phase offset signal varies according to a phase difference between the feedback signal and the driving signal;

a double-sided package including a platform having a central portion and an outer portion, sidewalls extending substantially upwardly and substantially downwardly from the outer portion of the platform;

the upwardly extending sidewalls and the platform forming a first cavity adapted to receive and electrically connect the quartz resonator;

the downwardly extending sidewalls and the platform forming a second cavity adapted to receive and electrically connect at least one electronic component;

a cover coupled with the first cavity defining a hermetic environment for containing the quartz resonator; and a printed circuit board coupled with the second cavity, the printed circuit board having a cavity facing surface adapted to receive at least one electronic component and an outward facing surface having a plurality of integral contacts adapted to facilitate electrical surface mountable connection to an electrical device.

11. The oscillator according to claim 1 wherein the AT-cut quartz resonator is tunable and the second cavity includes contacts conductively linked to the resonator for tuning.

12. The oscillator according to claim 1 wherein the controlled frequency signal has a nominal operating frequency of 622.08 Megahertz and an Absolute Pull Range of at least 50 ppm.

13. The oscillator according to claim 1 wherein the controlled frequency signal has a nominal operating frequency of about 644.531 Megahertz and an Absolute Pull Range of at least 50 ppm.

14. The oscillator according to claim 1 wherein the controlled frequency signal has a nominal operating frequency of about 666.514 Megahertz and an Absolute Pull Range of at least 50 ppm.

15. The oscillator according to claim 1 wherein the controlled frequency signal has a nominal operating frequency of about 669.326 Megahertz and an Absolute Pull Range of at least 50 ppm.

16. The oscillator according to claim 1 having a substantially rectangular footprint of about 5 millimeters by 7 millimeters.

17. The oscillator according to claim 1 having a footprint of an area less th about 40 square millimeters.

18. The oscillator according to claim 1 wherein the quartz resonator is configured to operate in fundamental mode.

19. The oscillator according to claim 1 wherein the crystal oscillator circuit further includes temperature compensation.

20. A frequency-adjustable oscillator suitable for digital signal clock synchronization, the oscillator comprising:

a double-sided package including a platform having a central portion and an outer portion, sidewalls extending substantially upwardly and substantially downwardly from the outer portion of the platform;

the upwardly extending sidewalls and the platform forming a first cavity adapted to receive and electrically connect a quartz resonator;

the downwardly extending sidewalls and the platform forming a second cavity adapted to receive and electrically connect at least one electronic component;

a crystal oscillator circuit for generating a driving signal and having a voltage-variable control input for adjusting a frequency of the driving signal, the crystal oscillator circuit including a voltage variable capacitive element responsive to the control input, an AT-cut quartz resonator received in the first cavity and operably linked to the voltage variable capacitive element, and a gain stage for energizing the quartz resonator;

a phase detector circuit for generating a phase offset signal;

a filter which operates on the phase offset signal to produce a VCO control signal;

a voltage controlled oscillator circuit operably linked to the filter and responsive to the VCO control signal for generating an analog controlled-frequency signal;

a frequency divider circuit having a preselected divider ratio operably linked between the voltage controlled-frequency oscillator circuit and the phase detector circuit for generating a reduced frequency feedback signal in response to the controlled-frequency signal, the phase detector circuit being responsive to the feedback signal and the driving signal such that the phase offset signal varies according to a phase difference between the feedback signal and the driving signal;

a sinewave-to-logic level translator circuit operably linked to the voltage controlled oscillator for generating a digital output signal responsive to the controlled-frequency signal, wherein the translator circuit is a differential receiver adapted to generate the digital output signal at voltage levels conventional for positive-referenced emitter coupled logic (PECL); and a cover coupled with the first cavity defining a hermetic environment for containing the quartz resonator.

21. The oscillator according to claim 20 wherein the following elements are integrated in a single semiconductor chip received in said second cavity:

the gain stage, the phase detector circuit, the voltage controlled oscillator circuit, and the frequency divider circuit.

22. A frequency-adjustable oscillator suitable for digital signal clock synchronization, the oscillator comprising:

a temperature sensor;

a temperature compensation logic operably linked to the temperature sensor for generating a capacitance adjustment;

a variable capacitance circuit having and being responsive to a control input for providing a variable capacitive load, the variable capacitance circuit also being responsive to the capacitance adjustment;

a resonator gain stage;

a quartz resonator operably linked to the gain stage and the variable capacitance circuit for generating a driving signal;

a phase detector circuit for generating a phase offset signal;

a filter which operates on the phase offset signal to produce a VCO control signal;

a voltage controlled oscillator circuit operably linked to the filter and responsive to the VCO control signal for generating an analog controlled-frequency signal;

a frequency divider circuit having a preselected divider ratio operably linked between the voltage controlled-frequency oscillator circuit and the phase detector circuit for generating a reduced frequency feedback signal in response to the controlled-frequency signal, the phase detector circuit being responsive to the feedback signal and the driving signal such that the phase offset signal varies according to a phase difference between the feedback signal and the driving signal;

a double-sided package including a platform having a central portion and an outer portion, sidewalls extending substantially upwardly and substantially downwardly from the outer portion of the platform;

the upwardly extending sidewalls and the platform forming a first cavity adapted to receive and electrically connect the quartz resonator;

the downwardly extending sidewalls and the platform forming a second cavity adapted to receive and electrically connect at least one electronic component;

a cover coupled with the first cavity defining a hermetic environment for containing the quartz resonator; and a printed circuit board coupled with the second cavity, the printed circuit board cover having a cavity facing surface adapted to receive at least one electronic component and an outward facing surface having a plurality of integral contacts adapted to facilitate electrical surface mountable connection to an electrical device.

23. The oscillator according to claim 22 wherein the following elements are integrated in a single semiconductor chip received in said second cavity:

the temperature sensor, the temperature compensation logic, the variable capacitance circuit, the gain stage, the phase detector circuit, the voltage controlled oscillator circuit, and the frequency divider circuit.

* * * * *